US008289022B2

(12) United States Patent
Ahn

(10) Patent No.: US 8,289,022 B2
(45) Date of Patent: Oct. 16, 2012

(54) MAGNETIC RESONANCE COMPATIBLE MAGNETIC FIELD DETECTION, BASED ON DIFFUSE REFLECTANCE OF NANO-MAGNET SETS

(75) Inventor: Doyeol Ahn, Seoul (KR)

(73) Assignee: University of Seoul Industry Cooperation Foundation, Seoul (KR)

( * ) Notice: Subject to any disclaimer, the term of this patent is extended or adjusted under 35 U.S.C. 154(b) by 160 days.

(21) Appl. No.: 12/696,652

(22) Filed: Jan. 29, 2010

(65) Prior Publication Data

US 2011/0187362 A1 Aug. 4, 2011

(51) Int. Cl.
*G01V 3/00* (2006.01)

(52) U.S. Cl. ......... 324/318; 324/322; 324/309; 324/304

(58) Field of Classification Search .......... 324/300–322; 333/219–235; 335/296–306; 382/128–131; 600/407–435; 365/198; 375/308; 424/490; 435/5; 607/94

See application file for complete search history.

(56) References Cited

U.S. PATENT DOCUMENTS

| | | | | |
|---|---|---|---|---|
| 3,435,342 | A * | 3/1969 | Burnsweig, Jr. et al. | 375/308 |
| 3,439,349 | A * | 4/1969 | Wolf et al. | 365/198 |
| 6,798,200 | B2 | 9/2004 | Fan | |
| 6,798,202 | B2 | 9/2004 | Savelainen | |
| 7,719,280 | B2 * | 5/2010 | Lagae et al. | 324/322 |
| 8,164,333 | B2 * | 4/2012 | Rugar et al. | 324/307 |
| 2005/0244337 | A1 * | 11/2005 | Wang et al. | 424/9.36 |
| 2005/0261763 | A1 * | 11/2005 | Wang et al. | 623/1.44 |
| 2005/0278020 | A1 * | 12/2005 | Wang et al. | 623/1.44 |
| 2006/0269479 | A1 * | 11/2006 | Colton et al. | 424/1.69 |
| 2007/0027532 | A1 * | 2/2007 | Wang et al. | 623/1.44 |
| 2008/0221430 | A1 | 9/2008 | Ochi et al. | |
| 2008/0252293 | A1 * | 10/2008 | Lagae et al. | 324/318 |
| 2010/0121420 | A1 * | 5/2010 | Fiset et al. | 607/94 |
| 2010/0301854 | A1 * | 12/2010 | Rugar et al. | 324/307 |
| 2011/0003279 | A1 * | 1/2011 | Patel | 435/5 |
| 2011/0062957 | A1 * | 3/2011 | Fu et al. | 324/307 |
| 2011/0095761 | A1 | 4/2011 | Ahn | |
| 2011/0117202 | A1 * | 5/2011 | Bourke et al. | 424/490 |
| 2011/0144478 | A1 * | 6/2011 | Zabow et al. | 600/420 |
| 2011/0187362 | A1 * | 8/2011 | Ahn | 324/307 |
| 2012/0065494 | A1 * | 3/2012 | Gertner et al. | 600/411 |

FOREIGN PATENT DOCUMENTS

| | | |
|---|---|---|
| WO | 2007/117604 A2 | 10/2007 |
| WO | 2007/118261 | 10/2007 |
| WO | WO 2011093627 A1 * | 8/2011 |

OTHER PUBLICATIONS

U.S. Appl. No. 11/967,616, filed Dec. 2007, Claypool.*

J.B. Pendry "Negative Refraction Makes a Perfect Lens" Physical Review Letters, vol. 85, No. 18, Oct. 30, 2000 pp. 3966-3969.

(Continued)

*Primary Examiner* — Melissa Koval
*Assistant Examiner* — Tiffany Fetzner
(74) *Attorney, Agent, or Firm* — Workman Nydegger

(57) ABSTRACT

A device to detect a magnetic field is disclosed. The device includes a first set of nano-magnets and a second set of nano-magnets. The first set of nano-magnets may be operable to transmit a radio frequency (RF) signal to a target, and a second set of nano-magnets may be operable to induce an electrical signal in response to a magnetic resonance signal generated from the target.

19 Claims, 4 Drawing Sheets

OTHER PUBLICATIONS

D.R. Smith, et al "Composite Medium with Simultaneously Negative Permeability and Permittivity" Physical Review Letters, vol. 81, No. 18, May 1, 2000, pp. 4184-4187.

Hyung Kwon Kim, et al., "Faraday's Induction Experiment in Nano-Transformers", IEEE Transactions on Nanotechnology, Mar. 2008, vol. 7, No. 2, 2008 IEEE, pp. 120-123.

Wai-Fung Cheong et al., "A Review of the Optical Properties of Biological Tissues", IEEE Journal of Quantum Electronics, Dec. 1990, vol. 26. No. 12, 1990 IEEE, pp. 2166-2185.

Avraham Lorber et al., "Net Analyte Signal Calculation in Multivariate Calibration", Analytical Chemistry, Apr. 15, 1997, vol. 69, No. 8, 1620-1626, 1997 American Chemical Society.

Lisette D'Souza et al., "Diffuse reflectance infrared fourier transform spectroscopic (DRIFTS) investigation of *E. coli, Staphylococcus aureus* and *Candida albicans*", Indian Journal of Marine Sciences, Mar. 2009, vol. 38(1), pp. 45-51.

Carl H. Smith et al., "Chip-Size Magnetic Sensor Arrays", prepared for Sensors EXPO May 21, 2002.

R. P. Cowburn, et al "Sensing magnetic fields using superparamagnetic nanomagnets" J. Appl. Phys. 87, 7082 (2000).

S. Chao, et al "Nanometer-scale magnetic resonance imaging" Rev. Sci. Instrum. 75, 1175 (2004).

M. Barbic, et al "Magnetic nanostructures as amplifiers of transverse fields in magnetic resonance", Solid State Nuclear Magnetic Resonance, vol. 28, Issues 2-4, Sep. 2005, pp. 91-105, Special issue in honor of Prof. Jerzy Blicharski.

Australian Patent Office; International Search Report and Written Opinion in corresponding PCT application (PCT/KR2010/007293); mailed Jan. 31, 2011.

International Search Report and Written Opinion from International Application No. PCT/KR2011/000496 dated Apr. 28, 2011.

U.S. Appl. No. 12/606,852, mailed Oct. 26, 2011, Office Action.

Cohen, Michael R. et al., "Diffuse Reflectance Measurements of Standard Diffusers" [online: http://www.4physics.com/tn3/lambertian.htm] Oct. 1, 2009.

U.S. Appl. No. 12/606,852, mailed Nov. 23, 2011, Office Action.

Cartwright, J., "Metamaterials boost MRI sensitivity," accessed at http://physicsworld.com/cws/article/news/36237, 2 Pages, Oct. 15, 2008.

U.S. Appl. No. 12/606,852, mailed Mar. 15, 2012, Notice of Allowance.

U.S. Appl. No. 12/606,852, mailed Apr. 25, 2012, Notice of Allowance.

\* cited by examiner

0
MAGNETIC RESONANCE COMPATIBLE MAGNETIC FIELD DETECTION, BASED ON DIFFUSE REFLECTANCE OF NANO-MAGNET SETS

CROSS REFERENCE TO RELATED APPLICATION

This application is related to U.S. patent application Ser. No. 12/606,852 filed Oct. 27, 2009.

BACKGROUND

Magnetic Resonance Imaging (MRI) is a medical imaging technique commonly used in radiology to visualize the internal structure and function of a body. MRI includes a magnet, such as 'C' shaped permanent magnet, resistive electromagnet and cylindrical superconducting electromagnet. Such magnet generates a powerful magnetic field to align the nuclear magnetization of hydrogen atoms in water in the body. Radio frequency (RF) field is used to systematically alter the alignment of this magnetization, causing the hydrogen nuclei to produce rotating magnetic field signals. These signals can be manipulated by additional magnetic fields to build up enough information to construct an image of the body. Because clinical magnets generally have a field strength, such as, in the range of 0.2-3.0 tesla (T) and a large swiss roll shape, the conventional MRI is neither portable nor cost effective.

DETAILED DESCRIPTION

Figure 1:
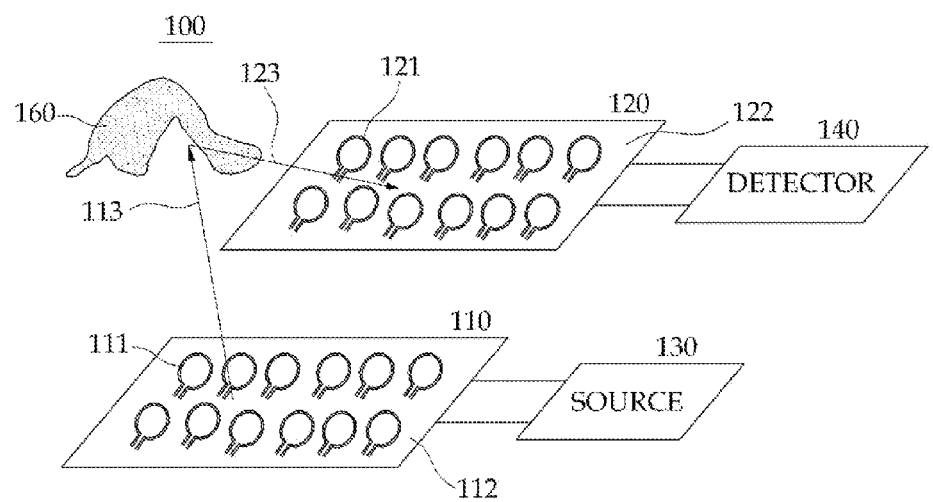
FIG. 1 shows a schematic diagram of an illustrative embodiment of a device to detect a magnetic field.

In one embodiment, a device to detect a magnetic field is provided. The device includes a first set of nano-magnets and a second set of nano-magnets. The first set of nano-magnets may be operable to transmit a radio frequency (RF) signal to a target, and a second set of nano-magnets may be operable to induce an electrical signal in response to a magnetic resonance signal generated from the target. A diffuse reflectance may be measured based on the electrical signal induced at the second set of nano-magnet.

The device can further include a source configured to provide an electrical supply signal to the first set of nano-magnets. The device can further include a controller to control a phase and/or a magnitude of the electrical supply signal. The RF signal transmitted from the first set of nano-magnets can be ranged between about 0.1 mT and about 1mT.

The device can further include a static magnetic field generator to generate a static magnetic field to align nuclear spins of the target. The RF signal from the first set of nano-magnets can excite nuclear spins of the target, and the magnetic resonance signal can be generated in response to the excited nuclear spins. The nuclear spins of the target can be resonant at a frequency between about 0.5 MHz and about 20 MHz.

The device can further include a detector configured to detect the electrical signal induced at the second set of nano-magnets. The device can further include a data processor to receive the electrical signal from the detector and to measure the diffuse reflectance based on the electrical signal. The data processor can calculate an absorption coefficient and a scattering coefficient of the target based on the measured diffuse reflectance. Further, the data processor can determine physical and structural properties of the target based on the absorption coefficient and scattering coefficient and create an image of the target based on the physical and structural properties.

The first set of nano-magnets and the second set of nano-magnets can be arranged in the same plane. Further, the first set of nano-magnets and the second set of nano-magnets can be arranged such that extended lines of the first and second sets of nano-magnets form an angle between about 90 degrees and about 180 degrees therebetween.

Each nano-magnet of the first and second sets can include ferromagnetic metals and/or transition metals. Further, each nano-magnet of the first and second sets can include a ring-type metal loop. The ring-type metal loop can include Ti/Au, Ti/Pt, Cr/Au, Cr/Pt, CoFe, NiFe, Co, Ni, or Fe, and the radius of the ring-type metal loop may be between about 300 nm and 1500 nm.

In another embodiment, provided is a method that includes transmitting an RF signal from a first set of nano-magnets to excite nuclear spins of a target, receiving a magnetic resonance signal generated from the target at a second set of nano-magnets to induce an electrical signal, measuring a diffuse reflectance based on the electrical signal, determining physical and structural properties of the target based on the diffuse reflectance, and creating an image of the target based on the physical and structural properties of the target. The method can further include calculating an absorption coefficient and a scattering coefficient based on the measured diffuse reflectance. The physical and structural properties of the target can be determined based on the absorption coefficient and scattering coefficient.

In another embodiment, a magnetic resonance imaging ("MRI") device includes a first set of nano-magnets operable to transmit an RF signal to a target, a second set of nano-magnets operable to receive a magnetic resonance signal generated from the target, a detector operable to detect an electrical signal induced at the second set of nano-magnets, a source operable to provide an electrical supply signal to the first set of nano-magnets, and a data processor operable to measure a diffuse reflectance based on the electrical signal, to determine physical and structural properties of the target based on the diffuse reflectance and to create an image of the target based on the physical and structural properties of the target.

In the following detailed description, reference is made to the accompanying drawings, which form a part hereof. In the drawings, similar symbols typically identify similar components, unless context dictates otherwise. The illustrative embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein, and illustrated in the Figures, can be arranged, substituted, combined, separated, and designed in a wide variety of different configurations, all of which are explicitly contemplated herein.

FIG. 1 shows a schematic diagram of an illustrative embodiment of a device to detect a magnetic resonance signal. A device 100 includes a first set of nano-magnets 110 operable to induce a radio frequency (RF) field to transmit an RF signal to a target 160, and a second set of nano-magnets 120 operable to receive a magnetic resonance signal generated from target 160 and to induce an electrical signal in response to the magnetic resonance signal. Device 100 may optionally include a source 130 to provide an electrical supply signal to first set of nano-magnets 110, and/or a detector 140 to detect the electrical signal from second set of nano-magnets 120.

First set of nano-magnets 110 may include a substrate 112 and multiple numbers of nano-magnets 111 arranged on substrate 112. In some embodiments, first set of nano-magnets 110 is operable to induce a radio frequency (RF) field in response to an electric field. The electric field is generated by an electrical supply signal, which may be provided from an external device. As an example, source 130 may be operably, for example, electrically coupled to first set of nano-magnets 110 to provide the electrical supply signal, such as AC current or AC voltage, to first set of nano-magnets 110. By way of examples, source 130 may include an AC power source to apply the electrical supply signal, i.e., an AC current or an AC voltage to first set of nano-magnets 110 such that nano-magnets 111 positioned on substrate 112 induce the RF magnetic field in response to the applied AC current or AC voltage. The RF magnetic field is a time-varying magnetic field because it is generated in response to AC current or AC voltage. The induced RF magnetic field on first set of nano-magnets 110 can be transmitted in the form of an RF signal 113. The strength of RF signal 113 can be approximately 0.3 mT-0.4 mT, 0.2 mT-0.5 mT or 0.1 mT-1 mT.

In some embodiments, source 130 may control the direction of RF signal 113 induced from nano-magnets 111 such that the RF signal is transmitted to a whole range of target 160. Particularly, source 130 may control a phase and a magnitude of the current (for example, AC current) which flows through nano-magnets 111 using, for example, a phased-array antenna control. As used herein, the term "phased-array antenna control" refers to a control of a phase and a magnitude of electrical supply signals supplied to each of nano-magnets 111 thereby sophisticatedly controlling a beam pattern of RF signals (including RF signal 113) induced from the electrical supply signals. Beam pattern of the RF signals is formed by shifting the phase of each electrical supply signal supplied to each of nano-magnets 111 individually, to provide constructive and destructive interference so as to steer the RF signals in the desired direction.

Target 160 can be an organ or a tissue of any organism, such as a human body, an animal, a plant, or any inorganic substance. FIG. 1 illustrates that target 160 is positioned above first and second sets of nano-magnets 110 and 120 to receive an RF signal from first set of nano-magnets 110 and to generate a magnetic resonance signal, which will be described in detail hereinafter. The position of target 160 with respect to first and second sets of nano-magnets 110 and 120 may be various. As one example, device 100 can be placed in a certain area (for example, an examination table) and a human can hold target 160 (for example, a human arm or finger) to be placed over first and second sets of nano-magnet 110 and 120 placed in the examination table. As another example, device 100 can be a hand-held device. A human can hold the hand-held device, i.e., device 100, such that first and second sets of nano-magnets 110 and 120 face target 160, resulting in scanning a desired part of target 160 (for example, a standing human body).

RF signal 113 transmitted to target 160 can excite nuclear spins of target 160. In one example, RF signal 113 causes nuclear spins of target 160 to be resonant at the local Larmor frequency of approximately 5 MHz-6 MHz, 1 MHz-10 MHz or 0.5 MHz-20 MHz. As used herein, the term "(nuclear) spins of target 160" refers to the intrinsic angular momentum of hydrogen atoms in water contained in target 160, which can interact with an external magnetic field. Assuming that target 160 is a part of a human body, for example an arm, positioned above first and second sets of nano-magnets 110 and 120, an alignment of a nuclear magnetization of hydrogen atoms in water contained in the arm can be perturbed in response to RF signal 113.

The excitation of the spins of target 160 can generate a magnetic resonance signal 123. Magnetic resonance signal 123 generated from target 160 can be transmitted to second set of nano-magnets 120.

Second set of nano-magnets 120 is operable to receive magnetic resonance signal 123 from target 160 and to induce an electrical signal from magnetic resonance signal 123. Second set of nano-magnets 120 may include a substrate 122 and multiple numbers of nano-magnets 121 arranged on substrate 122. In response to magnetic resonance signal 123 from target 160, an AC voltage is induced at nano-magnets 121 of second set of nano-magnets 120 based on Faraday's law of induction, and thus an AC current flows through nano-magnets 121 of second set of nano-magnets 120.

Detector 140 may be operably, for example, electrically coupled to second set of nano-magnets 120 and can detect the electrical signal induced at second set of nano-magnets 120. The electrical signal induced at second set of nano-magnets 120 can be used to create an image of target 160, as will be described later. By way of example, detector 140 may include a current detector or a voltage detector. Detector 140 may be electrically coupled to second substrate 122 of second set of nano-magnets 120 and detect the electrical signal induced from nano-magnets 121 positioned on second substrate 122 of second set of nano-magnets 120. By way of examples, the current detector which is used as detector 140 can detect a phase and a magnitude of the induced current from magnetic resonance signal 123 at second set of nano-magnets 120. These detected values (for example, the phase and magnitude of the induced current) obtained from the induced current can be used to measure a diffuse reflectance to create an image of target 160, which will be described later.

In one embodiment, first set of nano-magnets 110 and second set of nano-magnets 120 may be placed on the same plane as shown in FIG. 1. Each of nano-magnets 111 can be controlled to form beam patterns in a desired direction, thus, RF signal 113 transmitted from nano-magnets 111 can cover a whole range of target 160, and, thus, magnetic resonance signal 123 can be received at nano-magnets 112. Further, each of nano-magnets 121 can be controlled to form beam patterns in a desired direction to receive magnetic resonance signal 123 based on the location of target 160. Nano-magnets 111 may be arranged in any configuration on substrate 112, without limitation, to generate and transmit an RF signal to target 160. Nano-magnets 121 may be arranged in any configuration on substrate 122, without limitation, to receive a magnetic resonance signal from target 160. For example, as depicted in FIG. 1, the multiple numbers of nano-magnets 111 and 121 can be arranged in two rows on substrate 112 and 122, respectively. The number of nano-magnets 111 and 121 and arrangement of nano-magnets 111 and 121 can be determined based on the size and shape of target 160 and desired accuracy. As the number of nano-magnets 111 of first set 110 increases, more RF signals can be generated from nano-magnets 111 and controlling of transmit direction of RF signal 113 can be more sophisticated. Further, as the number of nano-magnets 121 of second set 120 increases, various types of beam patterns to receive magnetic resonance signal 123 at nano-magnets 121 can be formed.

Nano-magnets 111 and 121 may be nano-sized magnets which are composed of, for example, ferromagnetic metals and/or transition metals. For example, materials for nano-magnets may include, without limitation, Ti/Au, Ti/Pt, Cr/Au, Cr/Pt, CoFe, NiFe, Co, Ni, or Fe.

In some embodiments, nano-magnets 111 and 121 can be a ring-type metal loop as shown in FIG. 1. Nano-magnets 111 and 121 can have nano-sized radii of, for example, about 500 nm to 2000 nm, or about 700 nm to 1400 nm. Nano-magnets 111 and 121 can have nano-sized widths of, for example, about 50 nm to 500 nm, or about 200 nm to 500 nm. Nano-magnets 111 and 121 can be fabricated by electron beam lithography and lift-off process on substrates 112 and 122, respectively. Particularly, nano-magnets 111 and 121 can be fabricated by depositing a base metal layer for nano-magnets 111 and 121 on substrates 112 and 122, respectively, using any of variety of well-known metal deposition techniques, such as sputtering, electroplating, e-beam evaporation, thermal evaporation, laser-induced evaporation, and ion-beam induced evaporation, and then selectively removing the base metal layer to form nano-magnets 111 and 121 having a ring-type metal loop using the lift-off process. Herein, the term "lift-off process" refers to the process of creating structures of a target material on the surface of a substrate using a sacrificial material. By way of example, substrates 112 and 122 may have a substantially rectangular or square shape, and be comprised of, for example, Si/SiO2. The base metal layer can be composed of Ti/Au, Ti/Pt, Cr/Au, Cr/Pt, CoFe, NiFe, Co, Ni, or Fe.

Figure 2:
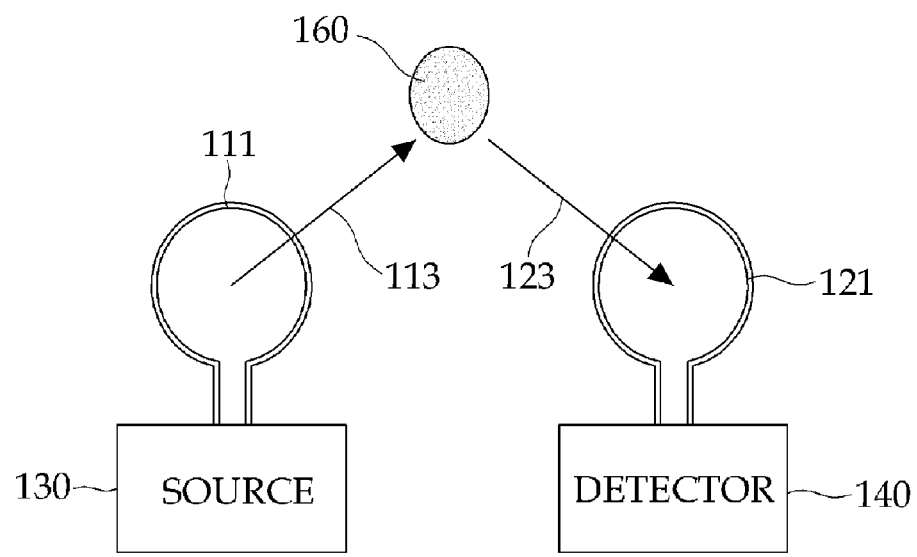
FIG. 2 shows a schematic diagram of the device of FIG. 1 illustrating detection of a magnetic resonance signal in accordance with one embodiment.
Figure 3:
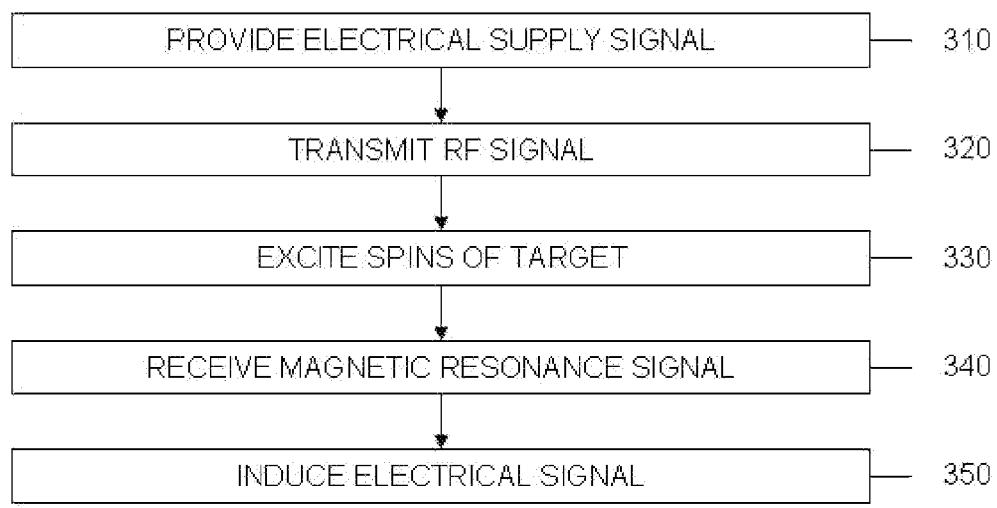
FIG. 3 is a flowchart of an illustrative embodiment of the method for detecting a magnetic resonance signal shown in FIG. 2.

With reference to FIGS. 2 and 3, a method for detecting a magnetic resonance signal in accordance with one embodiment is described hereinafter. FIG. 2 shows a schematic diagram of the device of FIG. 1 illustrating detection of a magnetic resonance signal in accordance with one example. FIG. 3 is a flowchart of an illustrative embodiment of the method for detecting the magnetic resonance signal shown in FIG. 2. As illustrated above with respect to FIG. 1, the electric supply signal, such as an AC current is provided from source 130 to nano-magnets 111 of first set of nano-magnets 110 (Step 310). Then, a time-varying RF magnetic field (that is, RF signal 113) is induced from the AC current through nano-magnets 111 of first set of nano-magnets 110 based on Faraday's law of induction, and RF signal 113 is transmitted to target 160 (Step 320). The nuclear spins are excited and precess around an axis along the direction of the RF magnetic field (Step 330). Magnetic resonance signal 123 is generated due to the excited spins of target 160. Then, magnetic resonance signal 123 is transmitted to nano-magnets 121 of second set of nano-magnets 120 coupled to detector 140 and nano-magnets 121 receive magnetic resonance signal 123 (Step 340). An electrical signal is induced in response to magnetic resonance signal 123 (Step 350). The induced electrical signal can be detected by detector 140.

Figure 4:
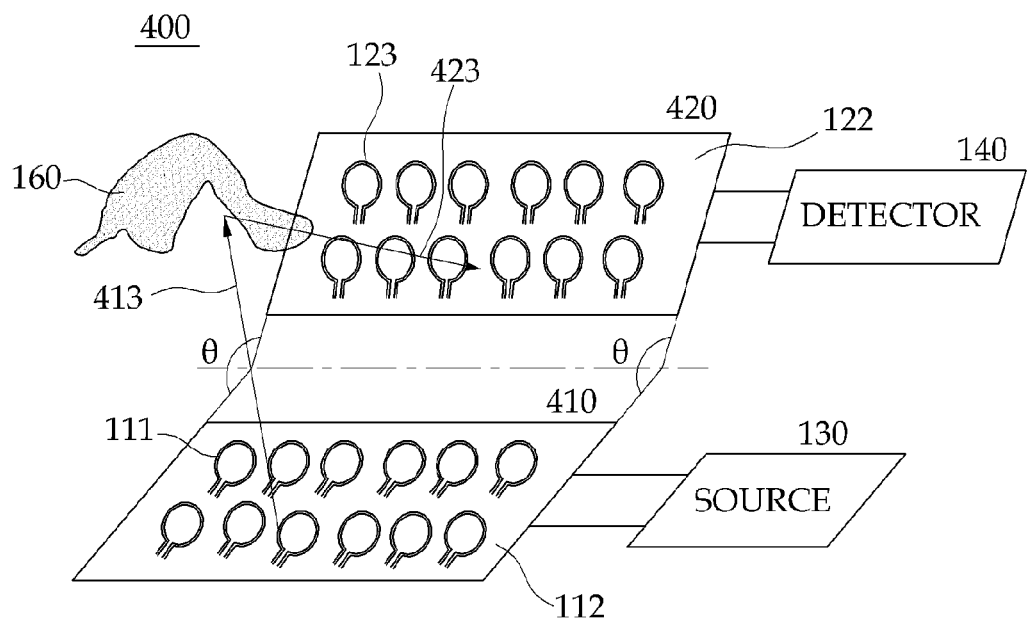
FIG. 4 shows a schematic diagram of another illustrative embodiment of a device to detect a magnetic field.

FIG. 4 shows a schematic diagram of another illustrative embodiment of a device to detect a magnetic resonance signal. Device 400 includes a first set of nano-magnets 410 operable to induce an RF field to transmit an RF signal to target 160, and a second set of nano-magnets 420 operable to receive a magnetic resonance signal from target 160 and to induce an electrical signal in response to the magnetic resonance signal. As shown in FIG. 4, first set of nano-magnets 410 and second set of nano-magnets 420 are not in the same plane. Instead, first and second sets of nano-magnets 410 and 420 are arranged such that the extended lines of first and second sets of nano-magnets 410 and 420 form a certain angle "θ" therebetween. In FIG. 4, since nano-magnets 111 and 121, substrates 112 and 122, source 130 and detector 140 which are denoted by the same reference numerals are the same as those shown in FIG. 1, the explanations on the elements are omitted. In this embodiment, an RF signal 413 transmitted from first set of nano-magnets 410 is transmitted to target 160 and a magnetic resonance signal is received at second set of nano-magnets 420 in a similar manner as the embodiment shown in FIG. 1. For example, the angle "θ" may be ranged between about 90-180 degrees, about 120-150 degrees, or about 135-145 degrees. When device 400 having the bent shape as shown in FIG. 4 is used, since the distance between target 160, and first and second sets of nano-magnets 410 and 420 can be decreased, desired signal strength of RF signal 413 can be decreased, comparing to device 100 where first and second sets of nano-magnets 110 and 120 are arranged in the same plane.

Figure 5:
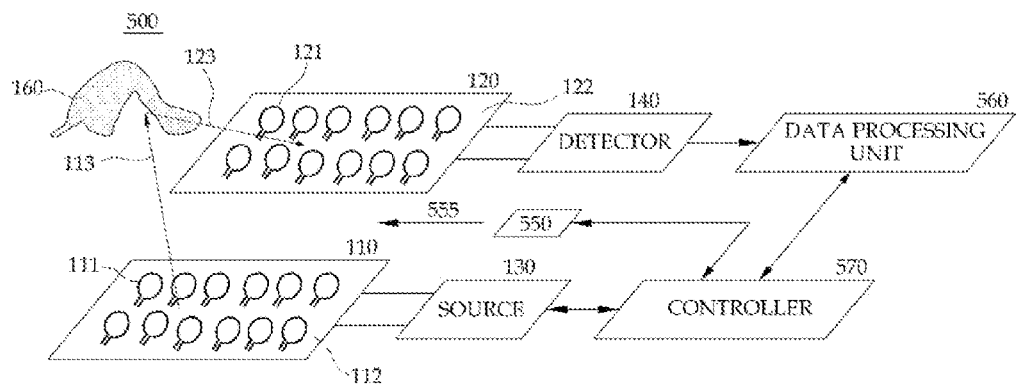
FIG. 5 shows a schematic diagram of another illustrative embodiment of a device to detect a magnetic resonance signal.

FIG. 5 shows a schematic diagram of another illustrative embodiment of a detecting device. A device 500 has the same constitutions as those shown in FIG. 1 except that device 500 has a static magnetic field generator 550, a data processor 560 and a controller 570. Static magnetic field generator 550 can apply a static magnetic field 555 (or a quasi-static magnetic field) to target 160 before source 130 provides to first set of nano-magnets 110 an electrical supply signal. When static magnetic field 555 is applied to target 160, spins of target 160 are aligned with the direction of static magnetic field 555. Such static magnetic field 555 allows a nuclear magnetization of all the spins of target 160 to be uniformly aligned in the same direction as static magnetic field 555 before exciting nuclear spins of target 160. Thus, all the spins of target 160 can be uniformly aligned in the direction of static magnetic field 555 so that spins of target 160 are tilted in response to RF signal 113 with respect to the direction of static magnetic field 555. The strength of static magnetic field 555 is much stronger than the earth's magnetic field. By way of examples, the strength of static magnetic field 555 may be approximately 3 mT-4 mT, 2 mT-5 mT or 1 mT-10 mT.

In one embodiment, data processor 560 can create images based on the electrical signal induced at second set of nano-magnets 120 from magnetic resonance signal 123. Particularly, magnetic resonance signal 123 received at second set of nano-magnets 120 is detected as an electrical signal, such as AC current or AC voltage, by detector 140 and the electrical signal is transmitted to data processor 560. Data processor 560 can measure a diffuse reflectance R which is a rate of diffuse reflection based on the electrical signal induced at second set of nano-magnets 120 from magnetic resonance signal 123. As used herein, the term "diffuse reflection" refers to a reflection of an RF signal at a number of angles from an uneven or granular surface of a target when the RF signal is transmitted to a target. Data processor 560 can determine physical and structural properties of target 160 based on the diffuse reflectance and create an image of target 160 based on the physical and structural properties of target 160.

The diffuse reflection is the result of a complex interplay of the intrinsic absorption and scattering properties of the organs or tissues of any organism (for example, target 160) according to a source-tissue-detector geometry (that is, geometry between source 130, target 160 and detector 140 in FIG. 5). Thus, an absorption coefficient and a scattering coefficient can be calculated based on the measurement of the diffuse reflectance, which will be described hereinafter. Further, physical and structural properties of target 160, for example, density, molecular size or cell size, and cellular structures of target 160, can be determined based on the intrinsic absorption and scattering properties of the organs or tissues of target 160. Thus, image of target 160 based on physical and structural properties can be created using the absorption coefficient and the scattering coefficient.

When first set of nano-magnets 110 and second set of nano-magnets 120 are not placed to face each other, but placed on the same plane as depicted in FIGS. 1 and 5, or placed to have an angle "θ" of 90-180 degrees therebetween as depicted in FIG. 4, a diffuse reflectance R and a transmittance T can be measured or calculated in data processor 560 based on RF signal 113 and magnetic resonance signal 123. In one embodiment, the electrical signal (for example, AC current) induced at second set of nano-magnets 120 from magnetic resonance signal 123 is used to measure the diffuse reflectance R. Particularly, a phase and a magnitude of the current flowing through nano-magnets 121 can be used. In some embodiments, data processor 560 can measure the diffuse reflectance R using a Bidirectional Reflectance Distribution Function (BRDF) or a Diffuse Reflectance Infrared Fourier Transform Spectroscopy (DRIFTS), which is well-known in the art. Details on the measuring diffuse reflectance using the BRDF and DRIFTS, see "Diffuse Reflectance Measurements of Standard Diffusers," by Michael R. Cohen et al., available at http://www.4physics.com/tn3/lambertian.htm, and "Diffuse reflectance infrared fourier transform spectroscopic (DRIFTS) investigation of *E. coli, Staphylococcus aureus* and *Candida albicans*," by Lisette D'Souza et al., Indian Journal of Marine Sciences, Vol. 38(1), March 2009, pp. 45-51, which are incorporated by reference herein in their entireties.

After the diffuse reflectance R is measured, a transmittance T can be calculated based on the measured diffuse reflectance R. As used herein, the term "transmittance" refers to a fraction of an intensity of RF signal that passes through target 160 over an intensity of incident RF signal (for example, RF signal 113) to target 160. Because magnetic resonance signal 123 can be received at second set of nano-magnets 120 and RF signal passing through target 160 cannot be received at second set of nano-magnets 120, transmittance of target 160 can be determined based on the magnitude of RF signal 113 from first set of nano-magnets 110 and the magnitude of magnetic resonance signal 123 from target 160 which is received at second set of nano-magnets 120.

In one embodiment, diffuse reflectance R and transmittance T can be given by following equations:

$$R = -\frac{\mu_s g}{[\mu_a + (1-g)\mu_s]} + \frac{h}{2}\{a_1\kappa - a_2\kappa - a_3\kappa\} \quad \text{(Equation 1)}$$

$$T = \frac{\mu_s g}{[\mu_a + (1-g)\mu_s]} e^{-\mu_t t} - \{a_1\kappa e^{\kappa t} - a_2\kappa e^{-\kappa t} - a_3\mu_t e^{-\mu_t t}\} \quad \text{(Equation 2)}$$

where, $\mu_a$ is an absorption coefficient of a target, $\mu_s$ is a scattering coefficient of a target, g=<cos θ> (average cosine of a scattering angle, κ is an effective attenuation coefficient, h=⅔[$\mu_a$+(1-g)$\mu_s$] and $a_1$, $a_2$, $a_3$ are parameters related to scattering or absorption property for a target.

Since diffuse reflectance R and transmittance T are obtained as described above (for example, diffuse reflectance R is measured in data processor 560 using the BRDF or DRIFTS, and transmittance T is calculated based on the measured diffuse reflectance R), the absorption coefficient $\mu_a$ the scattering coefficient $\mu_s$ can be obtained using Equations 1 and 2. By solving simultaneous equations, the absorption coefficient $\mu_a$ and the scattering coefficient $\mu_s$ can be uniquely determined from Equations 1 and 2. After the absorption coefficient $\mu_a$ and the scattering coefficient $\mu_s$ are determined based on diffuse reflectance R and transmittance T, physical and structural characteristics of target 160, for example, density, particle size, and cellular structures, can be determined based on the determined absorption coefficient $\mu_a$ and scattering coefficient $\mu_s$, which represent intrinsic absorption and scattering properties of organs or tissues, respectively. An image of target 160 can be constructed based on the absorption coefficient $\mu_a$ and the scattering coefficient $\mu_s$. Additional details on the calculation of absorption and scattering parameters using diffuse reflectance and transmittance, see "A Review of the Optical Properties of Biological Tissues," by WAI-FLING CHEONG et al., IEEE JOURNAL OF QUANTUM ELECTRONICS, VOL. 26. NO. 12, DECEMBER 1990, which is incorporated by reference herein in its entirety.

In one embodiment, a calibration can be used in determining the value of diffuse reflectance R and transmittance T. As used herein, the term "calibration" refers to a process of achieving a correct relationship between the measured variables. In one embodiment, a calibration using multivariate analytical method can be performed to achieve an exact value of diffuse reflectance R and transmittance T. The term "multivariate analysis" refers to an analysis of more than one statistical variable at a time. By way of examples, a relationship between the measured variables (e.g., a phase and a magnitude of the current induced from second set of nano-magnets 120) and the measured properties (e.g., diffuse reflectance R and transmittance T) for a specific object (e.g., target 160) can be calibrated by repetitive experimental measurements. Once the relationship between the measured variables and the calculated properties for a known object (i.e., a reference object for calibration) is calibrated, the relationship can be applied to an unknown object (for example, target 160). Therefore, exact values of diffuse reflectance R and transmittance T of target 160 can be accurately calculated based on the measured variables (e.g., the phase and magnitude of the current induced from second set of nano-magnets 120). Additional details on the multivariate calibration methods, see "Net Analyte Signal Calculation in Multivariate," by Avraham Lorber et al., Anal. Chem. 1997, 69, 1620-1626, which is incorporated by reference herein in its entirety.

In another embodiment, controller 570 is configured to control source 130, static magnetic field generator 550 and data processor 560. Controller 570 instructs source 130 to provide an electrical supply signal to first set of nano-magnets 110. By way of examples, controller 570 can control the phase and magnitude of the current in each of nano-magnets 111 such that the direction and strength of RF signal 113 can be adaptively controlled. Controller 570 may further instruct static magnetic field generator 550 to generate a static magnetic field 555. For example, Controller 570 can control a strength and direction of static magnetic field 555 to align nuclear spins of target 160. Further, controller 570 can instruct data processor 560 to collect data, for example, phase and/or frequency data of the electrical signal induced at second set of nano-magnets from detector 140. Data processor 560 is configured to associate with controller 570, collect data from detector 140, and generate and output images for display based on the collected data in response to the instructions of controller 570.

Figure 6:
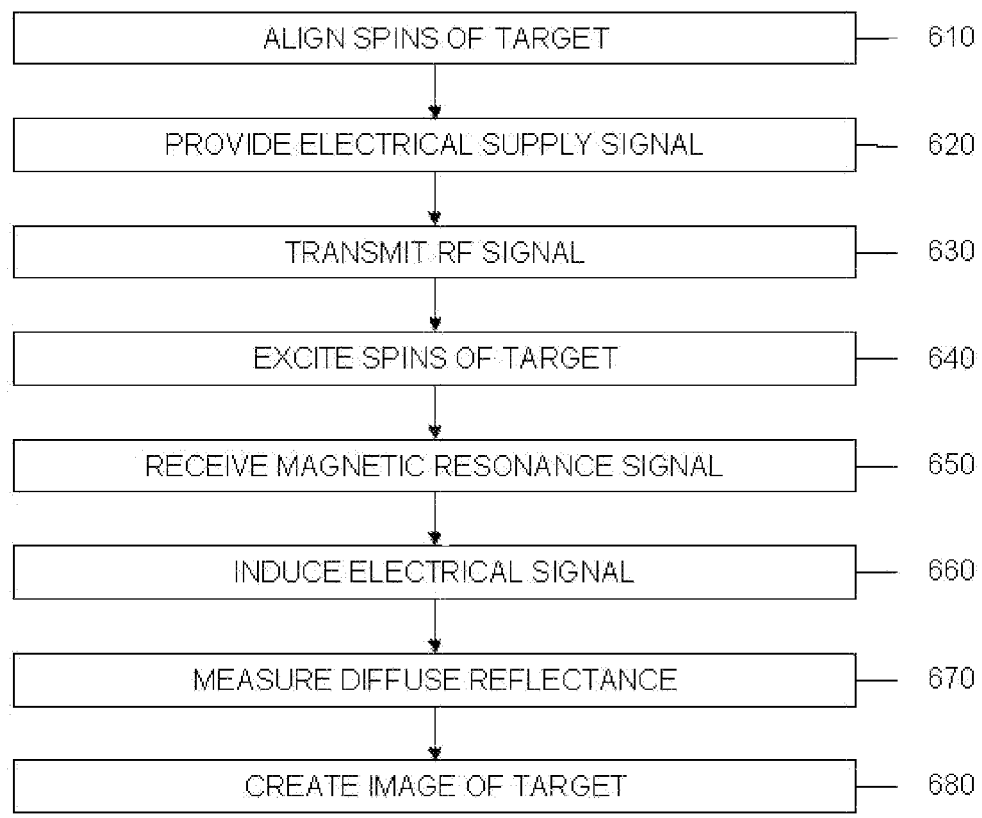
FIG. 6 is a flowchart of an illustrative embodiment of the method for detecting a magnetic resonance signal shown in FIG. 5.

FIG. 6 is a flowchart of an illustrative embodiment of the method for detecting a magnetic resonance signal shown in FIG. 5. As illustrated, a static magnetic field 555 generated from static magnetic field generator 550 causes nuclear spins of target 160 to align with the direction of static magnetic field 555 (step 610). An electrical supply signal such as an AC current is supplied from source 130 to nano-magnets 111 of first set of nano-magnets 110 (Step 620). RF signal 113 is induced from the AC current through nano-magnets 111 of first set of nano-magnets 110 based on Faraday's law of induction, and RF signal 113 is transmitted to target 160 (Step 630). RF signal 113 excites the nuclear spins of target 160 (Step 640). A magnetic resonance signal (for example, magnetic resonance signal 123) is generated due to the excited spins of target 160. Then, magnetic resonance signal 123 is received at second set of nano-magnets 120 (Step 650). In response to magnetic resonance signal 123, an electrical signal is induced at second set of nano-magnets (Step 660). Diffuse reflectance R can be measured in data processor 560 based on the electrical signal induced at second set of nano-magnets (step 670). Further, transmittance T is calculated based on the measured diffuse reflectance R, as aforementioned. Then, the absorption coefficient $\mu_\alpha$ and the scattering coefficient $\mu_s$ can be obtained based on diffuse reflectance R and transmittance T. Further, physical and structural properties of target 160 can be determined using the absorption coefficient $\mu_\alpha$ and the scattering coefficient $\mu_s$ in data processor 560. Accordingly, an image of target 160 can be created using the absorption coefficient $\mu_\alpha$ and the scattering coefficient $\mu_s$ based on diffuse reflectance R (step 680).

Figure 7:
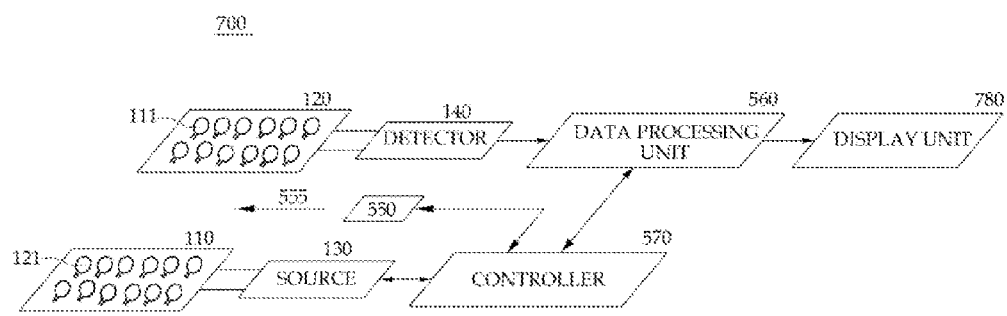
FIG. 7 shows a schematic diagram of still other illustrative embodiment of an MRI device.

FIG. 7 shows a schematic diagram of an illustrative embodiment of an MRI device. An MRI device 700 may include device 500. MRI device 700 includes first and second sets of nano-magnets 110 and 120, source 130, and detector 140. Further, MRI device 700 may include static magnetic field generator 550, data processor 560 and controller 570.

In one embodiment, MRI device 700 can further include a display unit 780 configured to display the images constructed from data processor 560. For example, display unit 780 includes a screen, such as LCD display screen, and is configured to display the output images based on the image data generated from data processor 560 on the screen. In other embodiment, MRI device 700 may include device 100 or 400 instead of device 500.

In some embodiments, MRI device 700 can be implemented as a portable health monitoring device. Since MRI device 700 can have a planar type as depicted in FIG. 7, MRI device 700 can be moved easily with respect to the position of target 160. MRI device 700 examines a target (for example, an organ or a tissue of the target) by generating an electrical supply signal (for example, the electrical supply signal to induce RF signal 113) to excite spins of the target, and detecting an electrical signal (for example, the electrical signal induced from magnetic resonance signal 123) caused by the excited spins. Since MRI device 700 can be configured as a hand-held portable MRI device with a planar type, a target can be scanned in any part (for example, a human finger or arm) at any place.

As described above, MRI device 700 including first and second sets of nano-magnets can have a small size with a planar type. Thus, the simple and small configuration of devices 100, 400 and 500 allows MRI device 700 to be compact and portable. Further, the strength of the applied RF signal is much smaller than that of a conventional MRI device. Specifically, MRI device 700 having nano-magnets uses magnetic field with strength in the order of mT (mili Tesla) while a conventional MRI device uses magnetic field of order of T (Tesla). Thus, a certain small part of a target can be examined by MRI device 700 conveniently and safely at home as well as a hospital.

One skilled in the art will appreciate that, for this and other processes and methods disclosed herein, the functions performed in the processes and methods may be implemented in differing order. Furthermore, the outlined steps and operations are only provided as examples, and some of the steps and operations may be optional, combined into fewer steps and operations, or expanded into additional steps and operations without detracting from the essence of the disclosed embodiments.

The present disclosure is not to be limited in terms of the particular embodiments described in this application, which are intended as illustrations of various aspects. Many modifications and variations can be made without departing from its spirit and scope, as will be apparent to those skilled in the art. Functionally equivalent methods and apparatuses within the scope of the disclosure, in addition to those enumerated herein, will be apparent to those skilled in the art from the foregoing descriptions. Such modifications and variations are intended to fall within the scope of the appended claims. The present disclosure is to be limited only by the terms of the appended claims, along with the full scope of equivalents to which such claims are entitled. It is to be understood that this disclosure is not limited to particular methods, reagents, compounds compositions or biological systems, which can, of course, vary. It is also to be understood that the terminology used herein is for the purpose of describing particular embodiments only, and is not intended to be limiting.

With respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

It will be understood by those within the art that, in general, terms used herein, and especially in the appended claims (e.g., bodies of the appended claims) are generally intended as "open" terms (e.g., the term "including" should be interpreted as "including but not limited to," the term "having" should be interpreted as "having at least," the term "includes" should be interpreted as "includes but is not limited to," etc.). It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to embodiments containing only one such recitation, even when the same claim includes the introductory phrases "one or more" or "at least one" and indefinite articles such as "a" or "an" (e.g., "a" and/or "an" should be interpreted to mean "at least one" or "one or more"); the same holds true for the use of definite articles used to introduce claim recitations. In addition, even if a specific number of an introduced claim recitation is explicitly recited, those skilled in the art will recognize that such recitation should be interpreted to mean at least the recited number (e.g., the bare recitation of "two recitations," without other modifiers, means at least two recitations, or two or more recitations). Furthermore, in those instances where a convention analogous to "at least one of A, B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). In those instances where a convention analogous to "at least one of A, B, or C, etc." is used, in general such a construction is intended in the sense one having skill in the art would understand the convention (e.g., "a system having at least one of A, B, or C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In addition, where features or aspects of the disclosure are described in terms of Markush groups, those skilled in the art will recognize that the disclosure is also thereby described in terms of any individual member or subgroup of members of the Markush group.

As will be understood by one skilled in the art, for any and all purposes, such as in terms of providing a written description, all ranges disclosed herein also encompass any and all possible subranges and combinations of subranges thereof. Any listed range can be easily recognized as sufficiently describing and enabling the same range being broken down into at least equal halves, thirds, quarters, fifths, tenths, etc. As a non-limiting example, each range discussed herein can be readily broken down into a lower third, middle third and upper third, etc. As will also be understood by one skilled in the art all language such as "up to," "at least," and the like include the number recited and refer to ranges which can be subsequently broken down into subranges as discussed above. Finally, as will be understood by one skilled in the art, a range includes each individual member. Thus, for example, a group having 1-3 cells refers to groups having 1, 2, or 3 cells. Similarly, a group having 1-5 cells refers to groups having 1, 2, 3, 4, or 5 cells, and so forth.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

The invention claimed is:

1. A magnetic resonance compatible device comprising:
a first set of nano-magnets operable to transmit a radio frequency (RF) signal to a target; and
a second set of nano-magnets operable to induce an electrical signal in response to a magnetic resonance signal generated from the target,
wherein a diffuse reflectance is measured based on the electrical signal induced at the second set of nano-magnets by a data processor.

2. The magnetic resonance compatible device of claim 1, further comprising
a source configured to provide an electrical supply signal to the first set of nano-magnets.

3. The magnetic resonance compatible device of claim 2, further comprising a controller configured to control a phase or a magnitude of the electrical supply signal.

4. The magnetic resonance compatible device of claim 1, wherein the RF signal transmitted from the first set of nano-magnets is ranged between 0.1 mT and 1 mT.

5. The magnetic resonance compatible device of claim 1, wherein the RF signal transmitted from the first set of nano-magnets excites nuclear spins of the target, and wherein the induced magnetic resonance signal is generated in response to the excited nuclear spins.

6. The magnetic resonance compatible device of claim 5, further comprising a static magnetic field generator configured to generate a static magnetic field to align the nuclear spins of the target.

7. The magnetic resonance compatible device of claim 5, wherein the nuclear spins of the target are resonant at a frequency between 0.5 MHz and 20 MHz.

8. The magnetic resonance compatible device of claim 1, further comprising a detector configured to detect the electrical signal induced at the second set of nano-magnets.

9. The magnetic resonance compatible device of claim 1, wherein the data processor is configured to receive the electrical signal from the detector.

10. The magnetic resonance compatible device of claim 9, wherein the data processor is further configured to calculate an absorption coefficient and a scattering coefficient of the target based on the measured diffuse reflectance.

11. The magnetic resonance compatible device of claim 10, wherein the data processor is further configured to determine physical and structural properties of the target based on the absorption coefficient and scattering coefficient and configured to create a magnetic resonance image of the target based on the physical and structural properties determined.

12. The magnetic resonance compatible device of claim 1, wherein the first set of nano-magnets and the second set of nano-magnets are arranged in the same plane.

13. The magnetic resonance compatible device of claim 1, wherein the first set of nano-magnets and the second set of nano-magnets are arranged in a configuration where extended lines of the first and second sets of nano-magnets form an angle between 90 degrees and 180 degrees.

14. The magnetic resonance compatible device of claim 1, wherein each nano-magnet of the first and second sets includes ferromagnetic metals and/or transition metals.

15. The magnetic resonance compatible device of claim 1, wherein each nano-magnet of the first and second sets comprises a ring-type metal loop.

16. The magnetic resonance compatible device of claim 15, wherein the ring-type metal loop includes Ti/Au, Ti/Pt, Cr/Au, Cr/Pt, CoFe, NiFe, Co, Ni, or Fe, and a radius of the ring-type metal loop is between 300 nm and 1500 nm.

17. A magnetic resonance method comprising:
transmitting an RF signal from a first set of nano-magnets in order to excite nuclear spins of a target;
receiving a magnetic resonance signal generated from the target at a second set of nano-magnets to induce an electrical signal;
measuring a diffuse reflectance based on the electrical signal by a data processor;
determining physical and structural properties of the target based on the measured diffuse reflectance; and
creating a magnetic resonance image of the target based on the physical and structural properties of the target determined from the measured diffuse reflectance.

18. The magnetic resonance method of claim 17, further comprising:

calculating an absorption coefficient and a scattering coefficient based on the measured diffuse reflectance, with the data processor, wherein the physical and structural properties of the target are determined based on the calculated absorption coefficient and calculated scattering coefficient which are used by the processor to create the magnetic resonance image of the target.

19. A magnetic resonance imaging ("MRI") device comprising:

a first set of nano-magnets operable to transmit an RF signal to a target;

a second set of nano-magnets operable to receive a magnetic resonance signal generated from the target;

a detector operable to detect an electrical signal induced at the second set of nano-magnets;

a source operable to provide an electrical supply signal to the first set of nano-magnets; and a data processor operable to measure a diffuse reflectance based on the electrical signal, in order to determine physical and structural properties of the target based on the measured diffuse reflectance and in order to create a magnetic resonance image of the target based on the determined physical and structural properties of the target.

* * * * *

UNITED STATES PATENT AND TRADEMARK OFFICE
CERTIFICATE OF CORRECTION

PATENT NO.        : 8,289,022 B2
APPLICATION NO.   : 12/696652
DATED             : October 16, 2012
INVENTOR(S)       : Ahn It is certified that error appears in the above-identified patent and that said Letters Patent is hereby corrected as shown below:

On the title page:

On Page 2, in item (56), under "OTHER PUBLICATIONS", in Column 1, Line 1, delete "et al" and insert -- et al., --, therefor.

On Page 2, in item (56), under "OTHER PUBLICATIONS", in Column 1, Line 2, delete "Permittivity"" and insert -- Permittivity", --, therefor.

On Page 2, in item (56), under "OTHER PUBLICATIONS", in Column 1, Line 5, delete "Nanotechnology,Mar." and insert -- Nanotechnology, Mar. --, therefor.

On Page 2, in item (56), under "OTHER PUBLICATIONS", in Column 1, Line 9, delete "26." and insert -- 26, --, therefor.

On Page 2, in item (56), under "OTHER PUBLICATIONS", in Column 1, Line 19, delete "al" and insert -- al., --, therefor.

On Page 2, in item (56), under "OTHER PUBLICATIONS", in Column 1, Line 20, delete "nanomagnets"" and insert -- nanomagnets", --, therefor.

On Page 2, in item (56), under "OTHER PUBLICATIONS", in Column 1, Line 21, delete "al" and insert -- al., --, therefor.

On Page 2, in item (56), under "OTHER PUBLICATIONS", in Column 1, Line 21, delete "imaging"" and insert -- imaging", --, therefor.

On Page 2, in (56), under "OTHER PUBLICATIONS", in Column 2, Line 1, delete "al" and insert -- al., --, therefor.

Signed and Sealed this
Fourth Day of June, 2013

Teresa Stanek Rea
*Acting Director of the United States Patent and Trademark Office*

CERTIFICATE OF CORRECTION (continued)
U.S. Pat. No. 8,289,022 B2

In the Specification:

In Column 7, Line 53, delete "reflectence" and insert -- reflectance --, therefor.

In Column 8, Line 23, delete "WAI-FLING" and insert -- WAI-FUNG --, therefor.